US006281508B1

(12) United States Patent
Lee et al.

(10) Patent No.: US 6,281,508 B1
(45) Date of Patent: *Aug. 28, 2001

(54) PRECISION ALIGNMENT AND ASSEMBLY OF MICROLENSES AND MICROCOLUMNS

(75) Inventors: Kim Y. Lee; Ho-Seob Kim, both of Fremont; Stephen A. Rishton, Hayward; Tai-Hon Philip Chang, Foster City, all of CA (US)

(73) Assignee: Etec Systems, Inc., Hayward, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/246,573

(22) Filed: Feb. 8, 1999

(51) Int. Cl.[7] .............................. G21K 1/08; H01J 19/42
(52) U.S. Cl. ...................... 250/396 R; 313/251; 445/33
(58) Field of Search ..................................... 359/811, 819; 250/396 R; 313/292, 251; 445/33

(56) References Cited

U.S. PATENT DOCUMENTS

| 4,200,794 | 4/1980 | Newbery et al. | 250/396 |
| 5,122,663 | 6/1992 | Chang et al. | 250/310 |
| 5,155,412 | 10/1992 | Chang et al. | 315/14 |

(List continued on next page.)

FOREIGN PATENT DOCUMENTS

| 0720203A1 | 7/1996 | (EP) . |
| 2441266 | 6/1980 | (FR) . |
| 2728385 | 6/1996 | (FR) . |

OTHER PUBLICATIONS

Chang, T.H.P. et al, "Electron beam microcolumn technology and applications" Proceedings Reprint, reprinted from Electron–Beam Sources and Charged–Particle Optics by the *Society of Photo–Optical Instrumentation Engineers*, vol. 2522, pp. 4–12 (1995).

Chang, T.H.P. et al., "Electron–beam microcolumns for lithography and related applications" *J. Vac. Sci. Technol.* B. 14(6) pp. 3774–3781 (1996).

Chang, T.H.P. et al., "Electron beam technology—SEM to microcolumn" *Microelectronic Engineering* 32 Pages 113–130 (1996).

Kim, H.S. et al., "Miniature Schottky electron source" *J. Vac. Sci. Technology* B 13(6), pp. 2468–2472 (1995).

Kratschmer, E. et al., "Experimental evaluation of a 20×20 mm footprint microcolumn" *J. Vac. Sci. Technology* B 14(6), pp. 3792–3796 (1996).

Lee, K. Y. et al., "High aspect ratio aligned multilayer microstructure fabrication" *J. Vac. Sci. Technology* B 12(6), pp. 3425–3430 (1994).

(List continued on next page.)

Primary Examiner—Huy Mai
(74) Attorney, Agent, or Firm—Greg Leitich (57) ABSTRACT

A method and the associated apparatus for alignment and assembly of microlenses and microcolumns in which aligning structures such as rigid fibers are used to precisely align multiple microlens components. Alignment openings are formed in the microlens components and standard optical fibers are threaded through the openings in each microlens component as they are stacked. The fibers provide sufficient stiffness and stability to the structure to precisely align the apertures of the microlens components and thereby allow for increased assembly efficiency over traditional microlens and microcolumn bonding techniques.

28 Claims, 7 Drawing Sheets

U.S. PATENT DOCUMENTS

| | | | |
|---|---|---|---|
| 5,874,177 | 2/1999 | Makita et al. | 428/596 |
| 6,011,269 | * 1/2000 | Veneklasen et al. | 250/492.23 |
| 6,023,060 | * 2/2000 | Chang et al. | 250/310 |
| 6,077,417 | * 6/2000 | Lee et al. | 205/769 |

OTHER PUBLICATIONS

Thomson, M.G.R. and Chang, T.H.P., "Lens and deflector design for microcolumns" *J. Vac. Sci. Technology* B 13(6), pp. 2445–2449.

Brochure, "Mask Aligner MA6"Karl Suss.

Brochure, "Microsystem Technology", Karl Suss.

Fabrication of vertically aligned aperture for E–beam microcolumn application, IBM technical disclosure bulletin, Dec. 1994.

Database abstract, Aug. 15, 1994.

* cited by examiner

PRECISION ALIGNMENT AND ASSEMBLY OF MICROLENSES AND MICROCOLUMNS

FIELD OF THE INVENTION

This invention relates to electron beam microcolumns, and in particular to a microcolumn assembly technique.

BACKGROUND OF THE INVENTION

Electron beam microcolumns based on microfabricated electron optical components and field emission sources operating under the scanning tunneling microscope (STM) aided alignment principle were first introduced in the late 1980s. Electron beam microcolumns are used to form a finely focused electron beam. See Chang, T. et al., "Electron-Beam Microcolumns for Lithography and Related Applications" *J. Vac. Sci. Technology,* B 14(6), pp. 3774–3781, November/December 1996, and Lee, K. et al, "High Aspect Ratio Aligned Multilayer Microstructure Fabrication" *J. Vac. Sci. Technology,* B 12(6), pp. 3425–3430, November/December 1994, incorporated by reference herein. These columns offer the advantages of extremely high resolution with improved beam current, small physical size, and low cost, and can be used in a wide variety of applications, such as electron beam lithography.

Microcolumns are high-aspect-ratio micromechanical structures including microlenses and deflectors. The microlenses are multilayers of silicon chips (with membrane windows for the lens electrodes) or silicon membranes spaced apart by 100–500 $\mu$m thick insulating layers. The lenses have bore diameters that vary from a few to several hundred $\mu$m. For optimum performance, the roundness and edge acuity of the bores are required to be in the nanometer range and alignment accuracy between components on the order of less than 1 $\mu$m. A microlens consists of a plurality of microlens components or elements, accurately aligned, for the purpose of focusing electronics. A microcolumn consists of one or more microlenses together with other components, such as deflections and cathodes, all aligned together.

Electrodes of the microlenses can be made from 1 to 2.5 $\mu$m thick silicon membranes by electron-beam lithography and reactive-ion etching (RIE). The starting material is, e.g., a 4 inch diameter and 500 $\mu$m thick double-sided polished wafer containing a plurality of 7 mm×7 mm die. At the center of each die is a 1 mm×1 mm membrane formed by wet isotropic etching using, e.g., either a highly boron doped or a reverse-biased p/n junction etch stop.

Figure 1:
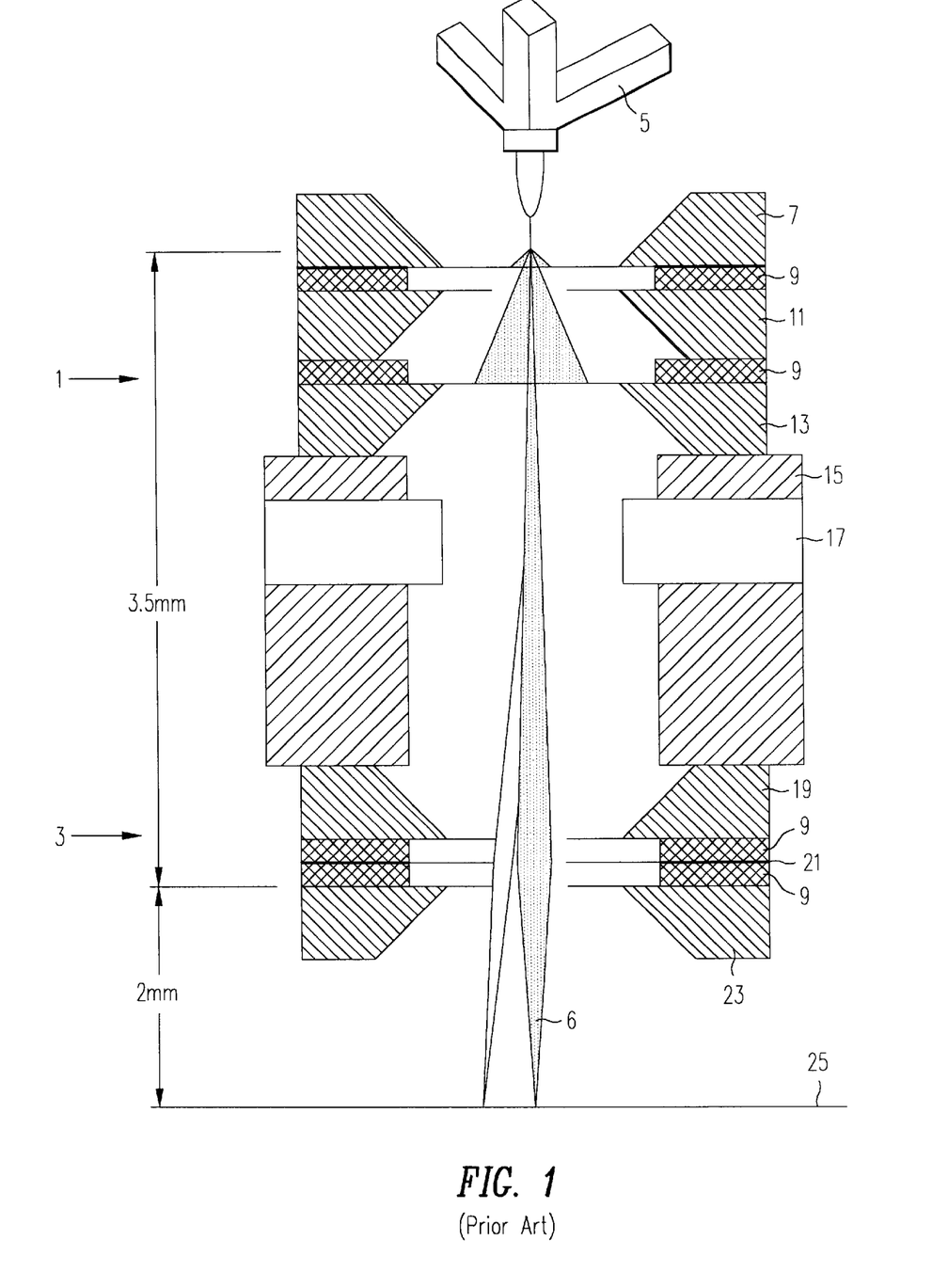
FIG. 1 illustrates a cross-sectional view of a prior art microcolumn.

FIG. 1 shows a cross-sectional view of a 1 kV microcolumn based on the well-known STM aligned field emission (SAFE) concept, showing source lens section 1 and Einzel lens section 3. Scanning tunneling microscope (STM) scanner 5 emits an electron beam 6 in the direction of sample plane 25. The beam 6 first passes through the source lens 1, composed of silicon apertures, 5 $\mu$m diameter extractor 7, 100 $\mu$m diameter anode 11, and 2.5 $\mu$m diameter limiting aperture 13. The three apertures are separated by two insulating spacers 9. The insulating spacers 9 are typically formed of a heat-resistant borosilicate glass, commonly known as Pyrex, but could be made of any other suitable insulator, such as SD-2 glass made by Hoya. The source lens 1 is mounted on aluminum mounting base 15, which contains an octupole scanner/stigmator 17. The electron beam 6 then passes through the Einzel lens 3, which is composed of two 100–200 $\mu$m diameter silicon apertures 19 and 23 with a 1–1.5 $\mu$m thick free-standing silicon membrane aperture 21 disposed therebetween. Each silicon layer is again separated by insulating spacers 9.

Figure 2A:
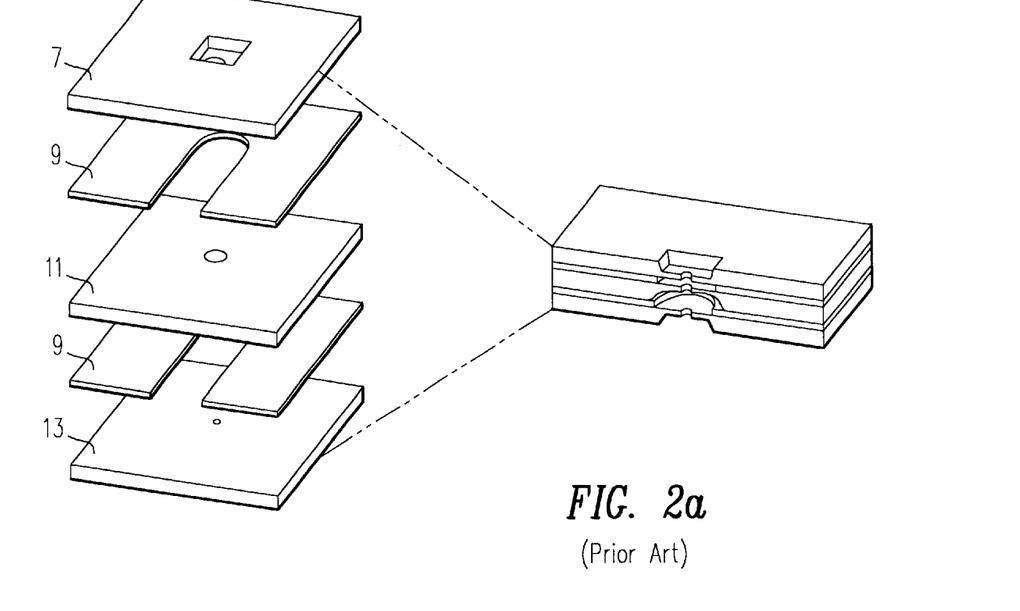
FIGS. 2a and 2b illustrate an expanded, three-dimensional view of the source lens and Einzel lens sections of FIG. 1.
Figure 2B:
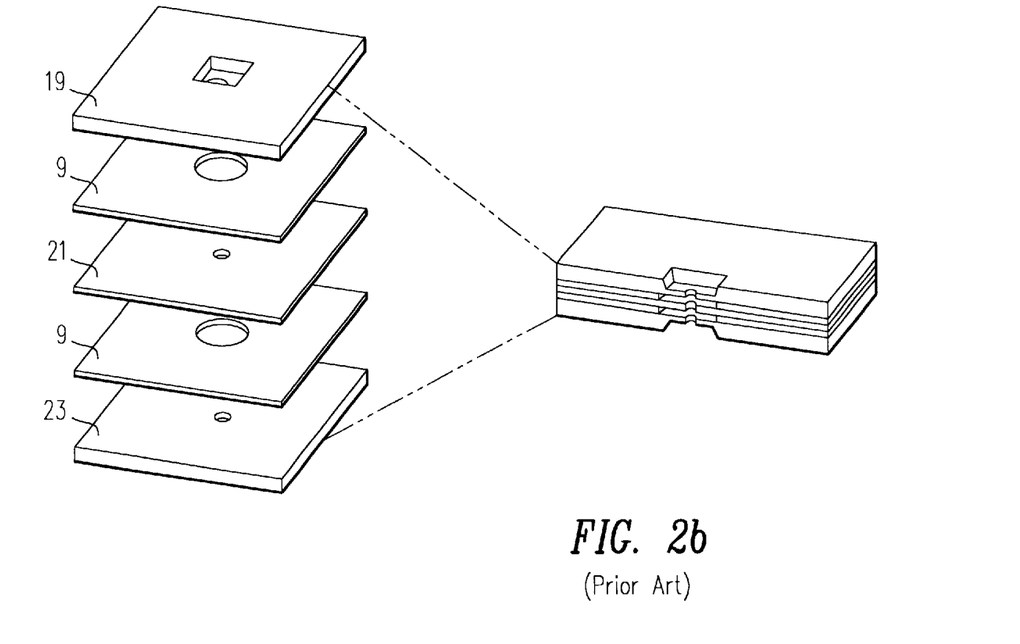

The source lens 1 and Einzel lens 3 are shown expanded and in greater detail in FIGS. 2(*a*)–(*b*) with similar reference numbers identifying the same structures.

The conventional approach to bonding the insulating and microlens layers of the microcolumn involves the use of anodic bonding. Anodic bonding is an electrochemical process for heat sealing of glass to metal and semiconductors. At elevated temperatures (300–600° C.), $Na_2O$ in the Pyrex or other glass dissociates to form sodium and oxygen ions. By applying a potential between a first silicon layer and a glass insulation layer, sodium ions in the glass migrate from the silicon-glass interface, while uncompensated oxygen anions move toward the induced positive charge of the silicon anode to form chemical bonds.

Anodic bonding disadvantageously must be conducted at elevated temperatures, which typically requires several hours of heat-up (to approximately 400° C.) and cool-down time, as well as a physical connection of a high voltage probe, during which time drift, bond-induced shift, and expansion can degrade the alignment. This process must then be repeated for each additional layer.

Assembly of the lenses and the column typically involves stacking together silicon components and borosilicate glass spacers and using anodic bonding to bond each layer to the microcolumn. Because the apertures in the microlenses must be precisely aligned, assembly of the microcolumn is complex and time-consuming. One assembly method requires that each lens be aligned under an optical microscope and that they be anodically bonded one layer at a time.

Accordingly, there is a clear need for a method of forming microcolumn structures that simplifies the assembly process by enabling the precise alignment of microlens components to be carried out quickly and easily.

SUMMARY OF THE INVENTION

In accordance with the present invention, a method for the alignment and assembly of microlenses and microcolumns is provided in which aligning fibers are used to precisely align multiple layer of microlenses.

In one embodiment, alignment openings are formed in the microlens components using conventional silicon processing techniques and alignments (such as commercially available optical fibers) are threaded through the openings in each microlens component as they are stacked. The fibers provide internal support for the microcolumn and allow for significantly faster assembly times over traditional bonding techniques. Any suitable rigid structure may be used for the aligners; the optical fibers are convenient. Their optical properties are not used.

The alignment openings may have different shapes to order to increase the ease with which the fiber aligners are threaded through the microlens components. In one embodiment, the alignment opening shape is two overlapping circular holes, the first hole being slightly larger than the diameter of the fiber aligner. The larger opening allows for easier threading of the aligner. After the aligner is threaded through the alignment opening, it is then shifted into the smaller opening which provides a snug fit with the aligner, thereby providing a precise reference location with which each layer can be aligned.

In a second embodiment, the alignment openings have a square shape, slightly larger than the diameter of the fiber aligner. After threading, the aligner is locked against two edges of the square opening, contacting the edge of the alignment opening in two places, thereby providing a precise reference location with which each layer can be aligned.

DETAILED DESCRIPTION

Figure 3A:
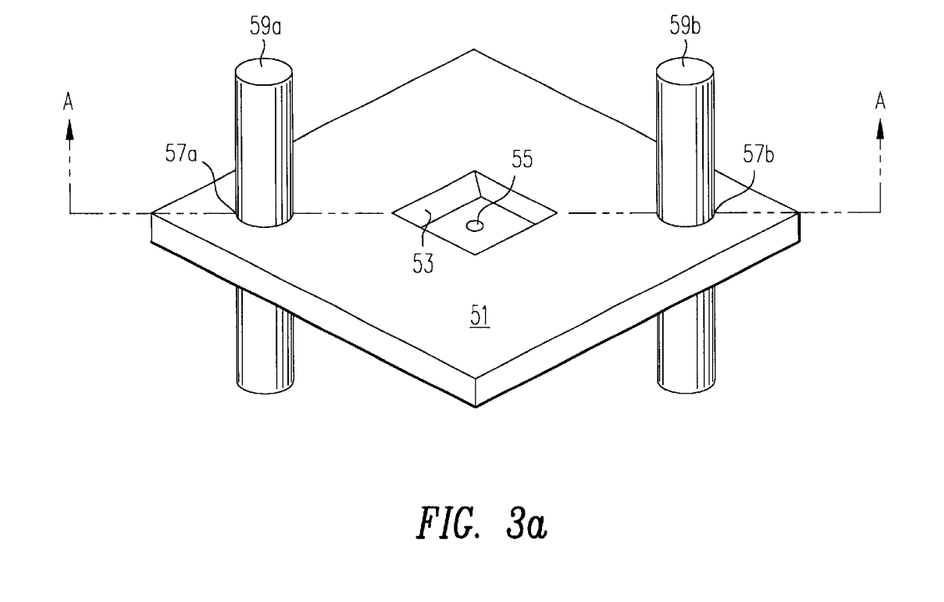
FIGS. 3a and 3b illustrate respectively a perspective and a side view of a microlens component according to the present invention.
Figure 3B:
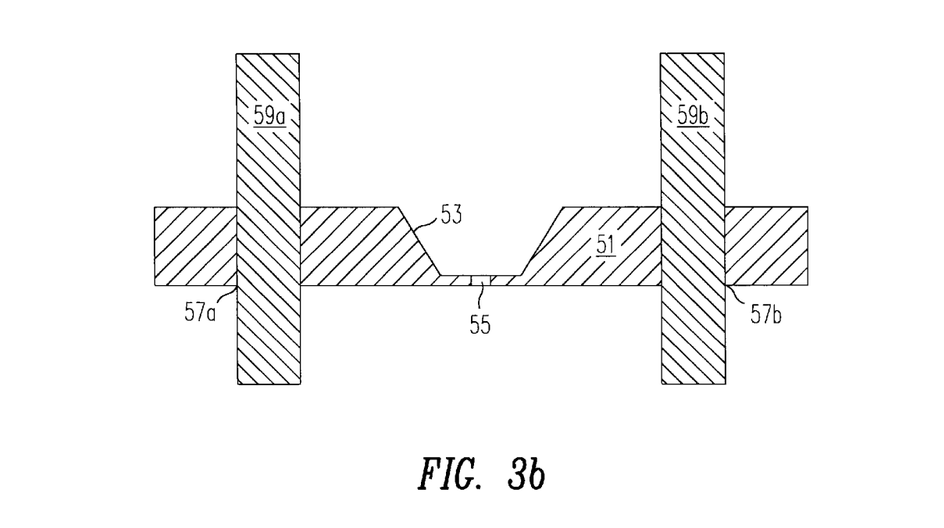

FIGS. 3a–3b show a microlens component 51 according to the present invention. Microlens component 51 is, for example, a 500 μm thick, 7 mm×7 mm silicon chip. At the center of microlens component 51 is a 1 to 1.5 μm thick, 1 mm×1 mm membrane window 53, at the center of which is a 2.5 μm diameter aperture 55. (These dimensions are merely illustrative.) FIG. 3b is a side view of the FIG. 3a structure. Aperture 55 must be precisely aligned with the apertures of the other microlens components (not shown) when the microlens is assembled. Rather than utilizing the painstaking prior art process of manually aligning the apertures using a microscope to observe the alignment, the present process utilizes a structure such as a standard optical fiber 59 to align the multiple layers.

First, alignment openings 57a–57b are formed in the microlens component 51. Because microlens component 51 is of silicon, conventional silicon processing techniques may be utilized to form the openings 57a–57b through the microlens component 51. Such techniques are well known in the art and enable the etching of holes in silicon to very precise tolerances. Optical lithography can be used to first pattern the holes in the silicon, followed by a silicon etching process to etch the holes through the microlens component 51. Techniques such as electron-cyclotron-resonance (ECR) etching, active silicon ion etching, reactive ion etching (RIE), inductively-coupled-plasma (ICP) etching, or any of the known methods for etching silicon may be used to quickly, reproducibly, and precisely form alignment openings 57a–57b. These techniques can be used to etch silicon with tolerances in the nanometer range, thereby allowing the apertures 55 to be positioned accurately with respect to the alignment openings 57a–57b. For improved efficiency, this etching step may be carried out in conjunction with and using the same processes as the etching steps required for forming window 53 and aperture 55.

After the alignment openings 57a–57b are formed, aligners 59a–59b are inserted through the openings 57a–57b. In one embodiment, aligners 59a–59b are short lengths of standard optical fiber, which are circular dielectric waveguides typically used to transport optical energy and information. These commercially available fibers are made of doped silica, possibly coated with several layers of cushioning material, such as acrylate. One suitable fiber material is commonly known as Pyrex. Pyrex optical fibers are commercially available from the Newport Corporation. This is just one example of the materials that may be used as the aligner. It is only necessary that the aligners be sufficiently strong and stiff to prevent shearing or bending of the assembled microlens, as described below. In addition, if the aligners are not removed from the microlens after assembly, typically they must be electrically nonconductive as well. The optical characteristics of the fibers are of no importance; optical fibers are utilized in this embodiment because they are relatively inexpensive, readily available, nonconductive, and are formed with very tight dimensional tolerances. Also, over the short lengths needed, they are sufficiently rigid.

Figure 4A:
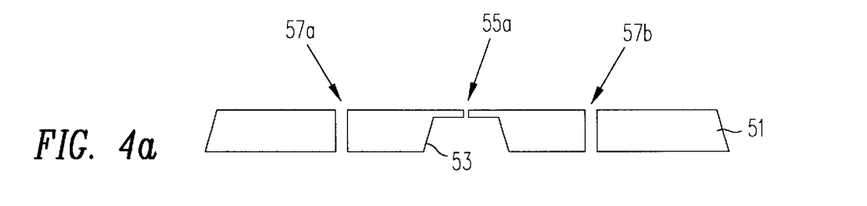
FIGS. 4a–4d illustrate the assembly of a microlens according to the present invention.
Figure 4B:
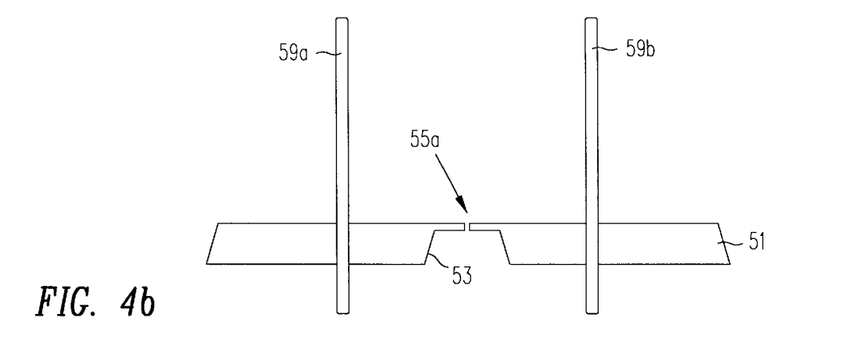
Figure 4C:
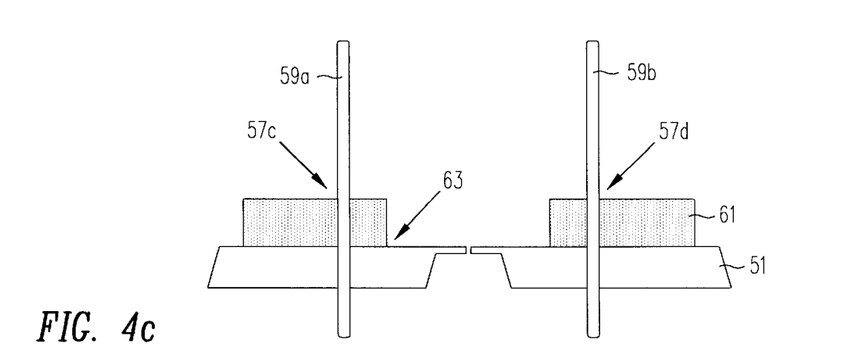

FIGS. 4a–4d illustrate in side views the assembly of a microlens according to one embodiment of the present invention using the FIG. 3a, 3b structures. FIG. 4a shows a side view of microlens component 51 after formation of window 53, aperture 55a, and alignment openings 57a–57b. Aligners 59a–59b are inserted into alignment openings 57a–57b, respectively, of microlens component 51, as shown in FIG. 4b. Next, an insulating spacer 61 is attached to the assembly by threading aligners 59a–59b through alignment openings 57c–57d in the spacer 61, and positioning spacer 61 atop microlens component 51. Spacer 61 is provided with large aperture 63, which must be aligned so as not to block aperture 55 in microlens component 51. Because the purpose of spacer 61 is to provide separation and insulation between the electrode layers of the microlens, aperture 63 can be made quite large and is not particularly difficult to properly align.

Figure 4D:
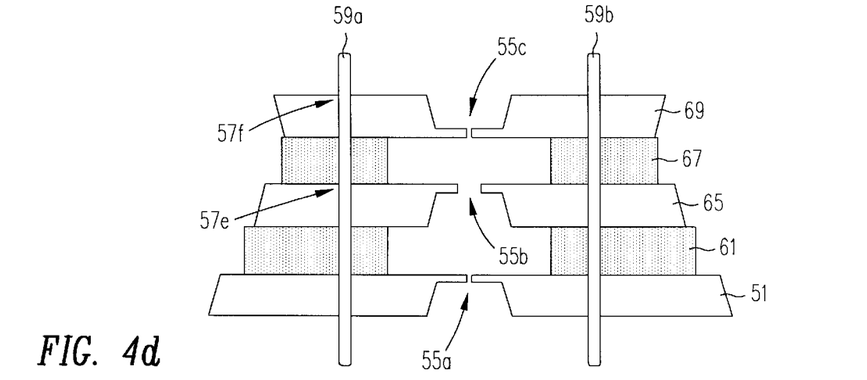

As can be seen in FIG. 4d, successive microlens components 65 and 69 each define small apertures 55b–55c which are to be precisely aligned with aperture 55a of the base microlens component 51. Microlens components 65 and 69 include alignment openings 57e–57f through which aligners 59a–59b are threaded. Because aligners 59a–59b are sufficiently rigid, when the elements of the microlens are assembled as shown in FIG. 4d, the layers are securely held relative to each other so that the alignment openings 57a–57f of each layer are precisely aligned. By accurately etching the alignment openings 57a–57f in relation to the apertures 55a–55c in each layer, the apertures 55a–55c will all also align correctly.

In the embodiments shown in FIGS. 3a–3b and 4, two aligners 59a–59b are used in the assembly of the microlens. The invention is not limited to only two aligners; it is also possible to assemble a microlens using a greater number of aligners or just one. When using only one aligner fiber, another structure may be used to better stabilize the microlens and prevent rotation of the microlenses relative to each other. For example, one edge of each microlens component may be aligned with another structure to prevent misalignment of the apertures caused by relative rotation of the layers.

Figure 5:
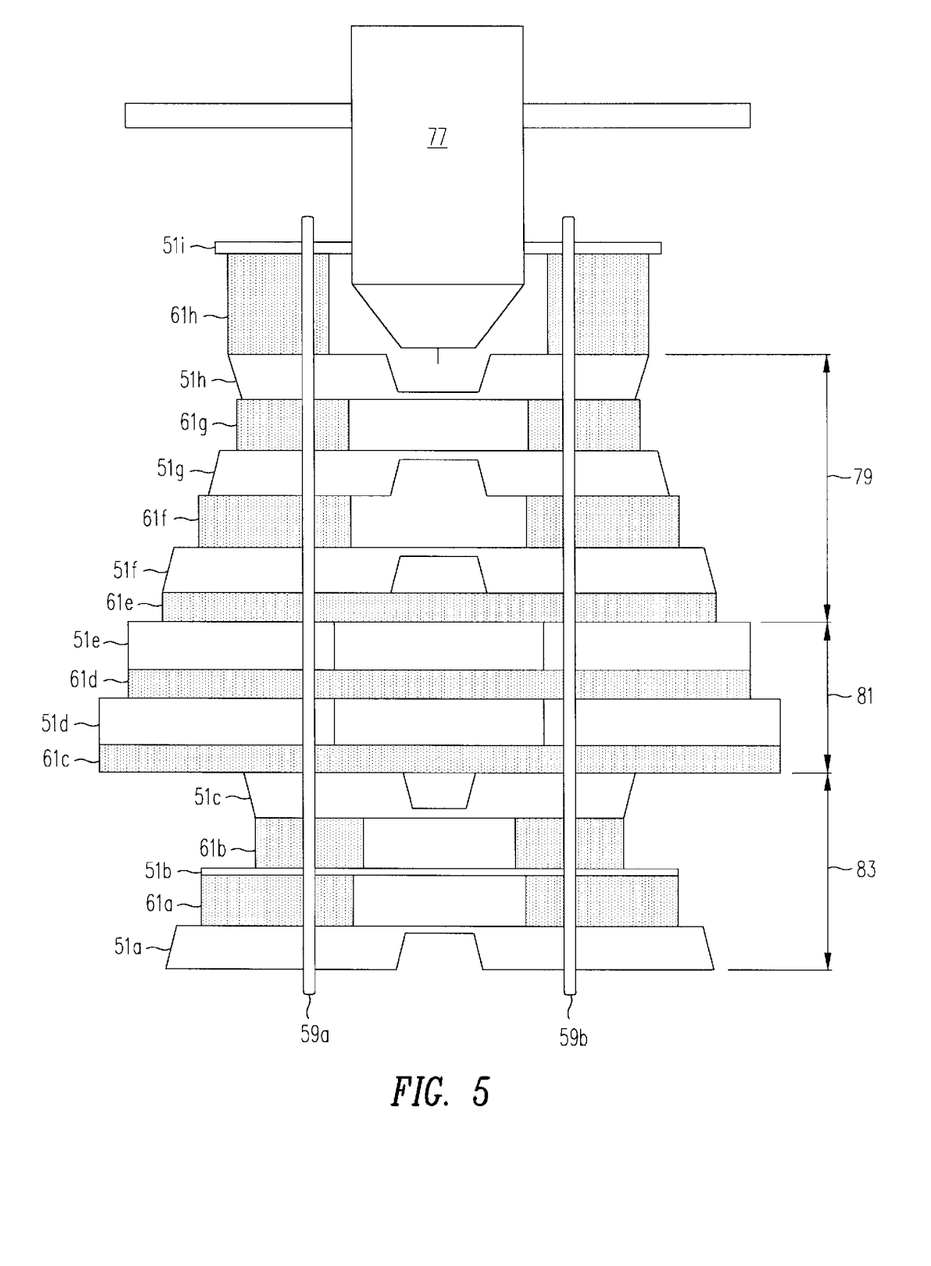
FIG. 5 illustrates a completed microcolumn according to the present invention.

FIG. 5 shows a side view of a completed microcolumn according to the present invention. The microcolumn is formed of layers of microlens elements and other components 51a–51i alternating with layers of insulating spacers 61a–61h, with aligners 59a–59b serving to keep the components properly aligned. At the top is conventional tip assembly 77, which may include, for example, a scanning tunneling microscope mounted in microlens 51i. Beneath the tip assembly 77 is the source lens 79 of the microcolumn, followed by the dual silicon deflector 81 and the Einzel lens 83.

After the microcolumn structure is complete, the layers may be bonded together to provide increased strength and stability. This is accomplished anodically as described above, e.g., by connecting the assembled structure to a voltage source and applying a potential across the layers of the microcolumn under elevated temperatures. By applying both a positive followed by a negative potential across the alternating glass-silicon layers, the individual layers of the microcolumn are anodically bonded. This may also result in the bonding of the optical fiber aligners 59 to the microlenses 51.

Alternatively, the layers are laser bonded. Aligners 59 are used to maintain the precise alignment of the assembly while the laser spot welding is carried out, and may be removed, if desired, after the layers are bonded together. However, because the aligners 59 are sufficiently small relative to the overall surface area of the microlens components 51 and usually are not located too close to the aperture 55 of the microlens components 51, they should not interfere with the operation of the microcolumn and do not have to be removed after assembly.

Excess length of aligner 59 is clipped off the microcolumn, or left in place to allow for additional structures to be added later.

The accuracy of the alignment of the microlens components is dependent on the accuracy of the aligners 59 and the precision of the alignment openings 57.

Because the aligners 59 are used to precisely align the apertures 55 of the microlenses, it is advantageous that the aligners 59 be precisely fitted into the alignment openings 57. This is balanced with the desire to increase the efficiency of the assembly process, however. Micromachining the alignment openings 57 to exactly the diameter of the fiber aligner 59 may provide accurate alignment of the apertures 55, but the threading of the aligner 59 through the equally-sized alignment opening 57 may be problematic. The alignment openings 57 are larger than the diameter of the aligners 59 to ease threading. Two methods of addressing this problem are illustrated in FIGS. 6a–6b and 7.

Figure 6A:
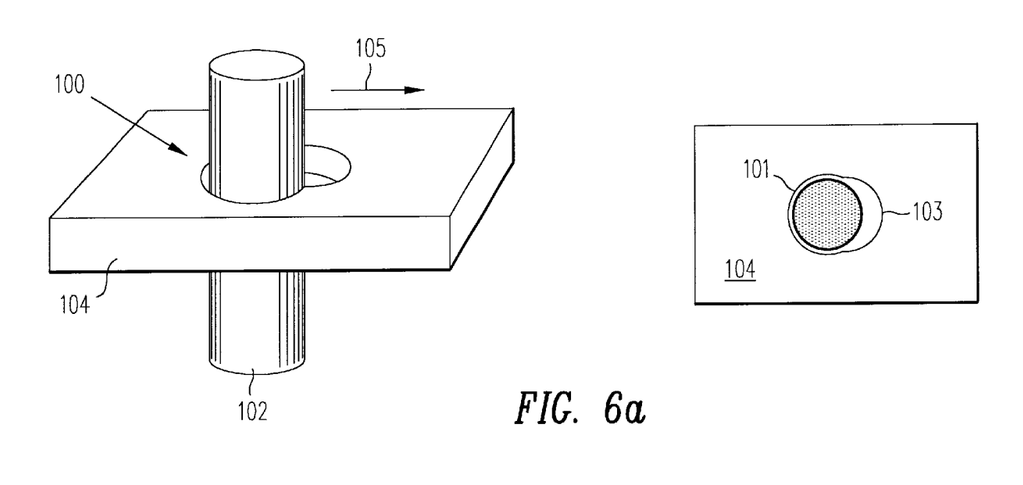
FIGS. 6a and 6b illustrate a first method of threading aligners through alignment openings.
Figure 6B:
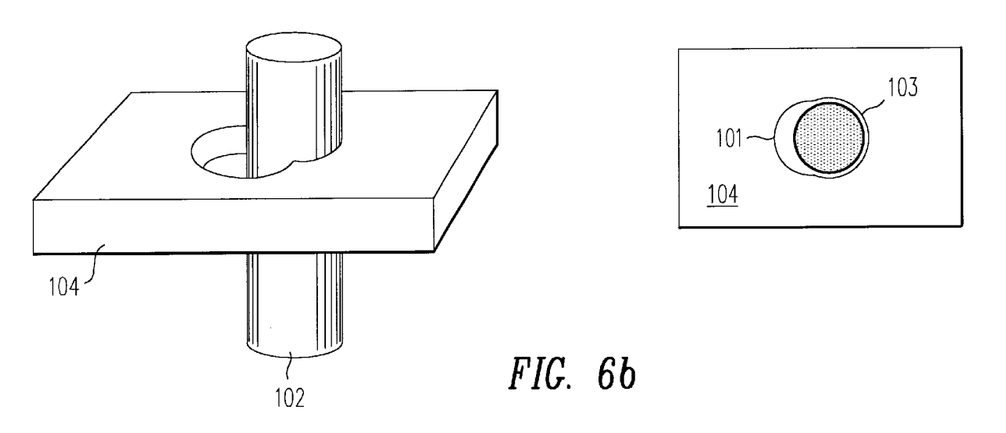
Figure 7:
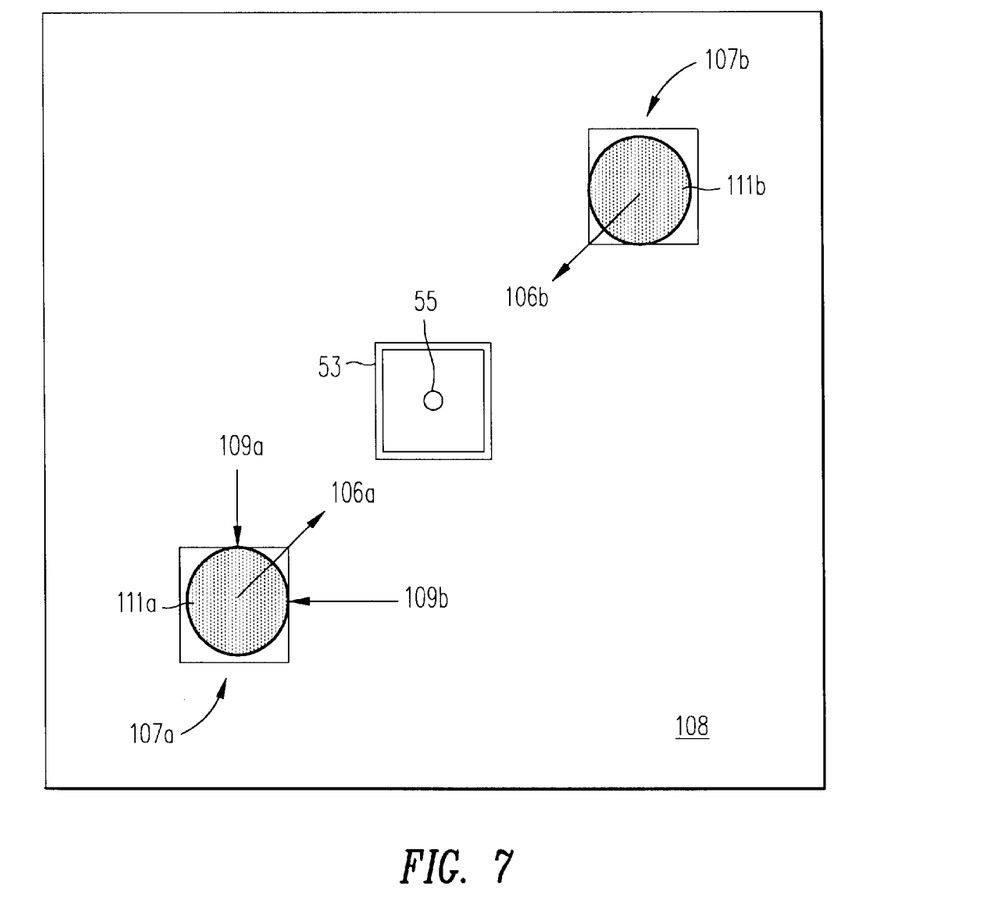
FIG. 7 illustrates a second method of threading aligners through alignment openings.

FIGS. 6a–6b each illustrate in perspective and plan views an embodiment in which the alignment opening 100 of microlens component 104 includes two eccentrically formed holes, threading portion 101 and locking portion 103. Threading portion 101 has a diameter slightly larger than the diameter of optical fiber aligner 102. Locking portion 103 has a diameter closely approximating that of aligner 102. In one embodiment, aligner 102 has a cross-sectional diameter of 250 µm, threading portion 101 has a diameter of 300–350 µm, and locking portion 103 has a diameter of 250–260 µm, depending on the tolerance requirements for the apertures 55 of the microlenses.

FIG. 6a shows the first step in which aligner 102 is threaded through the threading portion 101 of the alignment opening 100. Because of the increased diameter of threading portion 101, threading the aligner 102 through the alignment opening 100 is easily accomplished. After the aligner 102 is inserted, it is then moved into the locking portion 103 of the alignment opening 100 in the direction of arrow 105.

FIG. 6b shows aligner 102 fixed in locking portion 103. Precise etching of the location of locking portion 103 with reference to the location of aperture 55 (not shown in FIGS. 6a–6b) in each microlens component ensures that all layers will align properly.

FIG. 7 shows in a plan view a different method of providing for accurate alignment of the components. Here, alignment openings 107a–107b are formed in the shape of a square, each side of the square being slightly longer than the diameter of the associated aligner 111a–111b. After aligners 111a–111b are threaded through the alignment openings 107a–107b, they are pushed towards each other in the direction of arrows 105a–105b. A manipulator located beneath the bottom layer of the microlens is used to force the protruding ends of the aligners 111a–111b together.

When the aligner 111a is pushed towards an edge of the alignment opening 107a, the aligner 111a contacts the alignment opening at two contact points 109a–109b, which are located along two adjacent sides of the square alignment opening 107a. These two contact points 109a–109b provide the reference location for properly aligning the apertures 55 of the microlenses (not shown in FIG. 7). Because the optical fiber aligners 111a–111b are relatively short, they are sufficiently stiff to provide proper alignment throughout the length of the microcolumn.

Because the aligner 111a is pressed against the two contact points 109a–109b, the size of the alignment opening 107a does not affect the precision of the alignment, provided that the two contact points 109a–109b are properly placed. In this case, the aligners 111a–111b are locked against the two edges of the square alignment openings 107a–107b and the alignment accuracy is defined by the variation in the diameters of the fiber aligners 111a–111b, the reproducibility and positioning of the square alignment openings 107a–107b, and the perpendicularity of the two edges which define the placement accuracy.

It is not necessary that the alignment openings 107a–107b have perfectly square shapes, or that they be located at opposite corners of the microlens component 108. It is additionally not required that the aligners 111a–111b be forced inwards toward the center of the microlens 108. It is only necessary that the aligners 111a–111b be able to precisely align the multiple components by contacting an edge of the alignment openings 107a–107b to provide an identifiable reference location. For example, the two alignment openings 107a–107b can both be formed in the upper half of the microlens component 108 shown in FIG. 7, and can be formed as rectangles, triangles, or any other size polygon, so long as the contact points 109 can be accurately identified and positioned. Furthermore, the aligners 111a–111b may, for example, be arranged so that they are forced in a direction away from each other, so long as the forces they apply against the microlens component 108 complement each other in such as way as to maintain a stable alignment.

Although the invention has been described with reference to particular embodiments, the description is only an example of the invention's application and should not be taken as a limitation. Various other adaptations and combinations of features of the embodiments disclosed are within the scope of the invention as defined by the following claims.

What is claimed is:

1. A method for assembling a microlens assembly, comprising:

providing a first microlens component and a second microlens component;

forming a first base opening in said first microlens component;

forming a first alignment opening in said second microlens component; and threading a first rigid aligner through the first base opening and the first alignment opening, thereby aligning the first microlens component and the second microlens component.

2. The method of claim 1, further comprising bonding the first and second microlens components to an insulating layer disposed therebetween.

3. The method of claim 1, wherein:

said forming a first base opening comprises forming a first base opening and a second base opening;

said forming a first alignment opening comprises forming a first alignment opening and a second alignment opening both in said second micro lens component; and threading a second aligner through the second base opening and the second alignment opening.

4. The method of claim 3, wherein:

the threading a first aligner includes threading the first aligner through the first alignment opening such that the first aligner exerts a force on an inside edge of the first alignment opening in a first direction; and the threading a second aligner includes threading the second aligner through the second alignment opening such that the second aligner exerts a force on an inside edge of the second alignment opening in a second direction, said second direction being substantially opposite said first direction.

5. The method of claim 4, wherein said forming a second alignment opening includes forming the first and second alignment openings in the shape of a polygon.

6. The method of claim 5, wherein said forming a second alignment opening includes forming the first and second alignment openings in the shape of a square having sides longer than a diameter of the first and second aligners.

7. The method of claim 1, wherein the first aligner is a length of glass fiber.

8. The method of claim 7, wherein the glass fiber is borosilicate glass.

9. The method of claim 1, wherein the first and second microlens components are comprised of silicon.

10. The method of claim 9, wherein:

the forming a first base opening comprises etching the first base opening in the first microlens component; and the forming a first alignment opening comprises etching the first alignment opening in the second microlens component.

11. The method of claim 10, wherein said etching act includes anisotropic dry etching.

12. The method of claim 10, wherein said etching act includes reactive ion etching.

13. The method of claim 1, wherein:

said first alignment opening includes a threading portion and an intersecting locking portion, said locking portion being eccentric with said threading portion and having a diameter smaller than a diameter of the threading portion;

said threading includes inserting the first aligner through the threading portion of the first alignment opening, and moving the first aligner into the locking portion of the first alignment opening.

14. The method of claim 13, wherein said threading includes moving the first aligner into the locking portion of the first alignment opening, said locking portion of the first alignment opening having a diameter approximately equal to a diameter of the first aligner.

15. A microlens, comprising:

a first microlens component including a first base opening;

a spacer disposed on a first surface of the first microlens component;

a second microlens component defining a first alignment opening, said second microlens component being disposed on a surface of the spacer opposite the first microlens component;

a first aligner extending through the first base opening and the first alignment opening.

16. The microlens of claim 15, further comprising:

a second base opening in said first microlens component;

a second alignment opening in said second microlens component; and a second aligner extending through the second base opening and the second alignment opening.

17. The microlens of claim 16, wherein:

the first aligner exerts a force on an inside edge of the first alignment opening in a first direction; and the second aligner exerts a force on an inside edge of the second alignment opening in a second direction, said second direction being substantially opposite said first direction.

18. The microlens of claim 17, wherein the first and second alignment openings are in the shape of a polygon.

19. The microlens of claim 18, wherein said polygon is a square having sides longer than a diameter of the first and second aligners.

20. The microlens of claim 18, wherein:

the first direction of the force exerted by the first aligner is towards a vertex of the first alignment opening, whereby the first aligner contacts an inside edge of the first alignment opening at each of two sides of the polygon forming the vertex; and the second direction of the force exerted by the second aligner is towards a vertex of the second alignment opening, whereby the second aligner contacts an inside edge of the second alignment opening at each of two sides of the polygon forming the vertex.

21. The microlens of claim 15, wherein the first and second microlens components are bonded to the spacer.

22. The microlens of claim 15, wherein:

the spacer defines a first spacer opening;

the first aligner additionally extends through the first spacer opening.

23. The microlens of claim 15, wherein the first aligner is comprised of glass fiber.

24. The microlens of claim 15, wherein the first aligner is comprised of borosilicate glass fiber.

25. The microlens of claim 15, wherein the first aligner is round in cross-section.

26. The microlens of claim 15, wherein the first and second microlens components are comprised of silicon.

27. The microlens of claim 15, wherein:

said first alignment opening includes a threading portion and an intersecting locking portion, said locking portion being eccentric with said threading portion and having a diameter smaller than a diameter of the threading portion;

said first aligner extends through the first base opening and the locking portion of the first alignment opening.

28. The microlens of claim 27, wherein the locking portions of the first alignment opening has a diameter approximately equal to a diameter of the first aligner.

* * * * *